US005837571A

United States Patent [19]
Pathak

[11] Patent Number: 5,837,571
[45] Date of Patent: Nov. 17, 1998

[54] HIGH VOLTAGE TRANSISTOR FOR SUB-MICRON CMOS PROCESSES

[75] Inventor: Vijay Pathak, Roquefort les Pins, France

[73] Assignee: Texas Instruments Incorporated, Dallas, Tex.

[21] Appl. No.: 685,229

[22] Filed: Jul. 23, 1996

Related U.S. Application Data

[62] Division of Ser. No. 359,509, Dec. 20, 1994, Pat. No. 5,501,577.

[30] Foreign Application Priority Data

Dec. 23, 1993 [GB] United Kingdom .................... 9326344

[51] Int. Cl.⁶ .................................................. H01L 21/8238
[52] U.S. Cl. .......................... 438/199; 438/942; 438/945
[58] Field of Search ................................. 437/24, 27, 29, 437/34, 40, 41, 44, 62; 438/942, 945, 948, 257, 264; 430/34, 312, 199

[56] References Cited

U.S. PATENT DOCUMENTS

| | | | |
|---|---|---|---|
| 3,951,694 | 4/1976 | Monfret | 438/942 |
| 4,371,403 | 2/1983 | Ikubo et al. | 437/24 |
| 4,722,909 | 2/1988 | Parrillo et al. | 437/57 |
| 5,183,771 | 2/1993 | Mitsui et al. | 437/44 |
| 5,200,352 | 4/1993 | Pfiester | 437/44 |
| 5,424,234 | 6/1995 | Kwon | 437/44 |
| 5,480,746 | 1/1996 | Jinbo et al. | 430/311 |
| 5,604,059 | 2/1997 | Imura et al. | 430/311 |
| 5,635,316 | 6/1997 | Dao | 430/311 |

*Primary Examiner*—John Niebling
*Assistant Examiner*—Michael S. Lebentritt
*Attorney, Agent, or Firm*—Richard L. Donaldson; William B. Kempler

[57] ABSTRACT

This invention relates to methodology to resolve the problem of low drain/source breakdown voltage (BVdss) in small geometry devices with thin gate oxide. Improved drain diffusion profile implanting through disjoint NSD/NWELL windows in the extended drain region, This provides essentially an improved lightly diffused (LDD) structure. Further this invention relates to alternative methods to resolve the problem of low drain/source breakdown voltage in other structures which can be achieved by for example, building a number of side wall oxide layers, impurity compensation or oxygen implantation. The improved LDD structure to which this invention relates has a number of advantages when compared with other solutions. It enables high voltage transistors to be fabricated with high drive capability, without additional process steps being required to implement the structure. The inventions will find applications wherever a high voltage capability is required to interface with the outside world. Such designs would include automotive applications; programming transistors for Field Programmable Gate Arrays; Robust I/O's and ESD Protection Circuits.

5 Claims, 3 Drawing Sheets

HIGH VOLTAGE TRANSISTOR FOR SUB-MICRON CMOS PROCESSES

This is a division of application Ser. No. 08/359,509, filed Dec. 20, 1994 now U.S. Pat. No. 5,501,577.

This invention relates to methodology to resolve the problem of low drain/source breakdown voltage (BVdss) in small geometry devices with thin gate oxide.

BACKGROUND OF THE INVENTION

Conventional solutions to improve BVdss require either thicker gate oxide or employ overlapping NWELL diffusions which generally leads to higher threshold voltages (Vt) or higher series resistance, which in turn limits the drive capability of the transistor.

SUMMARY OF THE INVENTION

According to one aspect of the present invention there is provided a semiconductor device comprising a control electrode capable of establishing a channel region in use; and two doped regions each electrically connected to said channel region such that a current can flow from one doped region to the other when the channel region is established and wherein at least one of said doped regions has a graded profile the thickness of which decreases towards the channel region; whereby in use the device has a relatively high breakdown voltage.

This has the advantages of providing improved drain diffusion profile implanting through disjoint NSD/NWELL windows in the extended drain region. This provides essentially an improved lightly diffused (LDD) structure.

Further this invention relates to alternative methods to resolve the problem of low drain/source breakdown voltage in other structures which can be achieved by, for example, building a number of side wall oxide layers, impurity compensation or oxygen implantation.

The improved LDD structure to which this invention relates has a number of advantages when compared with other solutions. It enables high voltage transistors to be fabricated with high drive capability, without additional process steps being required to implement the structure.

The inventions will find applications wherever a high voltage capability is required to interface with the outside world. Such designs would include automotive applications; programming transistors for Field Programmable Gate Arrays; Robust I/O's and ESD Protection Circuits.

BRIEF DESCRIPTION OF THE DRAWING

Reference will now be made, by way of example, to the accompanying drawings in which.

DETAILED DESCRIPTION

High voltage transistors find many useful applications in circuit design, which may range from a programming transistor for Field Programmable Arrays to an output transistor in an automotive application. To achieve high voltage withstand capability in a transistor the electric field near the gate/drain region, for an N-channel transistor, must be reduced. The high electric field region, which must be reduced, is caused by the curvature effects of shallow source/drain diffusions in the substrate. These effects are more pronounced in sub-micron geometry as the source/drain diffusions tend to be even more shallow than in other geometries.

Figure 1:
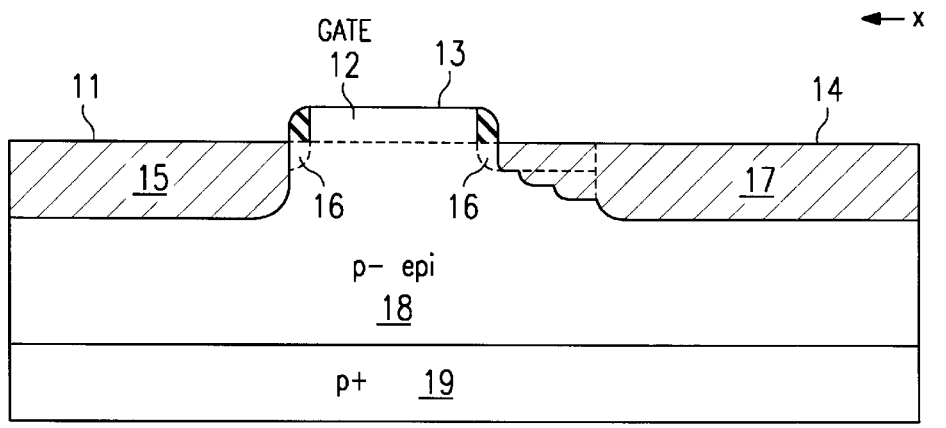
FIG. 1, is a diagram of the cross-section of the arrangement for achieving high voltage breakdown after implant diffusions.
Figure 2:
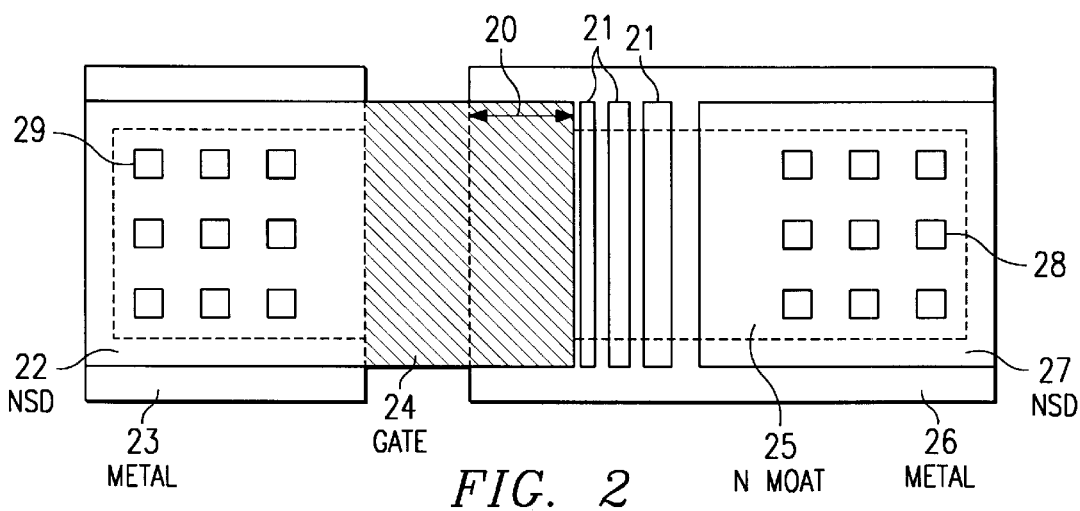
FIG. 2, is a plan representation of FIG. 1 showing, in particular, the disjoint strips through which diffusions are implanted.

The conventional methodology, of increasing gate oxide thickness, to achieve a reduced value in the high electric field region near to the gate/drain region requires additional process steps. With reference to FIGS. 1 and 2, the prime methodology of this invention increases the BVdss with a design which produces a graded diffusion profile in the gate/drain region without additional process steps being required.

FIG. 1 is a diagram, in section, of the arrangement for achieving high voltage breakdown, after implant diffusion, by the methodology of this invention. A P+ substrate (19) has a deposited, or grown, P epitaxial layer (18) covering it. Into which an NSD diffusion (15 and 17) creates the base for the source (11) and drain (14) contact points. The high concentration source/drain profile is gradually terminated with a profile from under the gate region (12) with the LDD (16) towards the drain diffusion (17) under the drain contact area (14). The metal overhang (13) over part of the gate is retained, as device simulation suggests its retention will lower the peak electric field.

FIG. 2 is a diagram of the plan of the arrangement shown in FIG. 1. The metallisation (23), (26) has been removed from over the gate region (24) and to create bonding windows to the drain region (28) and source regions (29) allowing direct contact to be made to the NSD diffusion (22), (27). Metal has been retained to form the metal overhang (20). The disjoint strips (21) are formed by NWELL/NSD diffusion through mask windows. The number of disjoint strips (or rings) could be changed. Increasing the number of strips would produce, what may be considered, a more perfect profile. The distance between these strips is arranged so that they join up after diffusion. Bonding windows have been shown in plan only.

Figure 3:
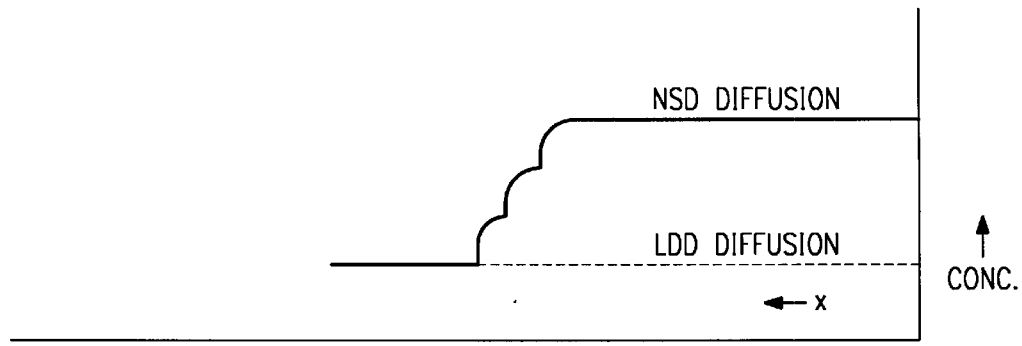
FIG. 3, is a diagram showing this graded profile achieved after diffusion and its relationship to the disjoint strips (21) shown in FIG. 2.

FIG. 3 is a diagram showing a graded profile of a type which may be achieved using three disjoint strips. An increasing depth of diffusion resulting from a wider disjoint strip.

As illustrated in FIGS. 1 and 2, the high concentration source/drain profile is gradually terminated under the gate with the LDD, helped with the implant diffusions through the disjoint strips. The distance between the disjoint strips is arranged so that they join up after diffusion to produce a graded profile of a type shown in FIG. 3.

Since the lateral diffusion is mostly dependent on the volume of dopant dissolved prior to diffusion drive or thermal anneal. The widths of the diffusion strips are made progressively smaller as they move from the drain area towards the gate. The reduction in width is to achieve the required graded profile. The separation between the strips will normally be less than twice the desired vertical diffusion. Increasing the number of diffusion strips will produce a more regular profile.

Employing NSD diffusions in the extended drain region has the effect of reducing the drain resistance and consequently increasing transistor drive capability. In sub-micron geometries, with the possibility of smaller moat-to-moat spacing, NSD diffusions may be sufficient to form the required graded junction. If not sufficient then NWELL diffusions will most likely be required, carried out from mask windows common to NWELL and NSD.

Device simulations using a Semiconductor Device Simulation software package show that in metal overhang structures, such as discussed in this disclosure, the equipotential lines are more sparse than in the standard case where metal does not overhang the poly-silicon of the gate. The consequence of this is that devices with metal overhang will have a lower peak electric field.

To investigate and record the effects of the graded profile on BVdss, device structures of the type within this disclosure are implanted on a bar processed in DMOS-4 in Gizs flow. For convenience a 44 Pin JLCC package is selected for assembly. The following table details the relevant Pin-outs and describes these structures. Only structures which relate to this disclosure are listed.

| Pin No. | Function | W/L μm/μm | Metal Overhang | NSD/NWELL In The Extended Drain Region |
|---------|----------|-----------|----------------|----------------------------------------|
| 7 | Ground | | | |
| 38 | NCH Trans | 40/0.8 | Yes | Standard |
| 37 | NCH Trans | 40/1.4 | Yes | Standard |
| 36 | NCH Trans | 40/0.8 | No | Standard |
| 35 | NCH Trans | 40/1.4 | No | Standard |
| 34 | NCH Trans | 40/1.4 | Yes | Continuous NWELL |
| 33 | NCH Trans | 40/1.4 | Yes | 1 NWELL Strip |
| 32 | NCH Trans | 40/1.4 | No | Continuous NWELL |
| 31 | NCH Trans | 40/1.4 | No | 1 NWELL Strip |
| 30 | NCH Trans | 40/1.4 | Yes | 1 NSD Strip |
| 29 | NCH Trans | 40/1.4 | No | 1 NSD Strip |

For these purposes only one strip of NWELL or NSD is used, although more strips could be employed—but at the expense of the drain area. As the objective is to investigate and record the effect of the graded profile on BVdss, the poly-gate on these structures is left floating.

Figure 4A:
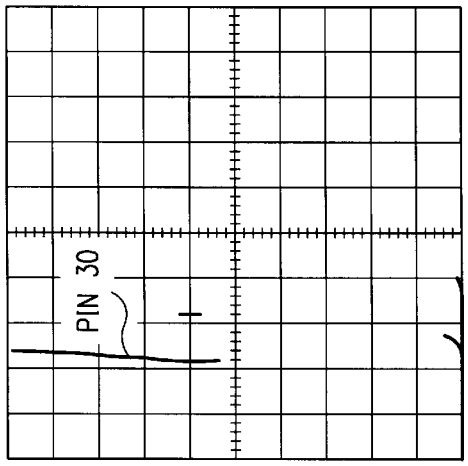
FIG. 4, is a graph of I-V characteristics of experimental structures at low currents with reference to particular PIN numbers.
Figure 5A:
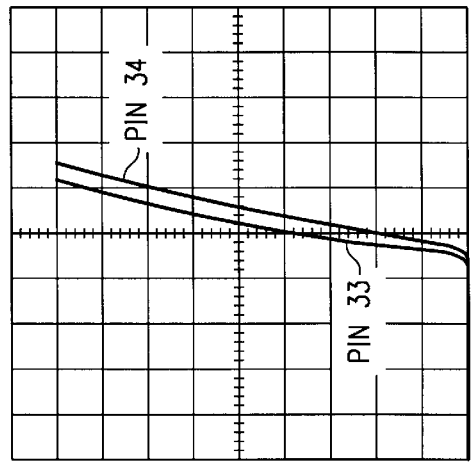
FIG. 5, is a graph of I-V characteristics of experimental structures at high currents with reference to the same PIN numbers identified in FIG. 4.
Figure 4B:
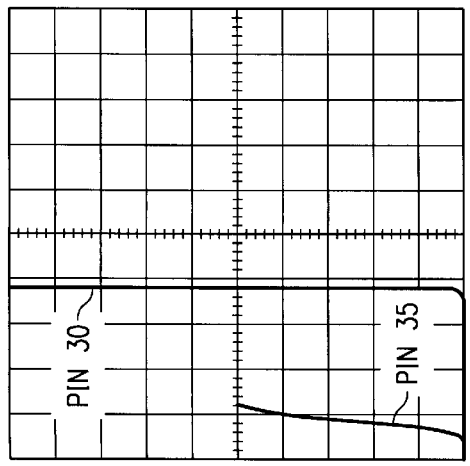
Figure 5B:
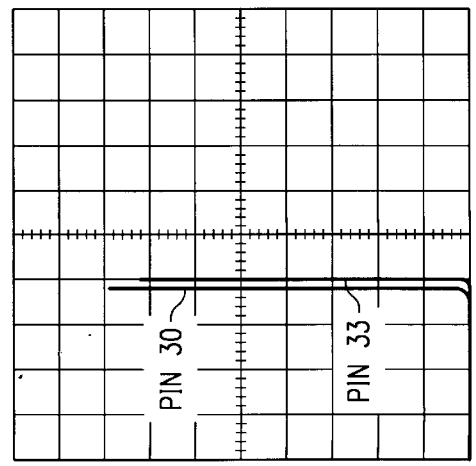

The reverse breakdown characteristics (BVdss) of the structures listed in the proceeding table are shown in FIGS. 4 and 5. FIG. 4 shows the BVdss at low currents, identified are specific Pin Numbers from the proceeding table. Pin 35 being the typical breakdown voltage of a standard structure. FIG. 5 shows the BVdss at high currents and identifies Pin numbers of the structures previously listed.

The values shown in FIGS. 4 and 5 clearly show that additional diffusions in the drain region beneficially increase the BVdss, with sharper I-V characteristics when compared with standard transistors. All structures with NSD or NWELL diffusion strips have a positive temperature coefficient of breakdown voltage (negative temperature coefficients for standard structures) indicating that these structures exhibit true avalanche breakdown characteristics.

The impact of metal overhang on these structures may not be fully assessed from their I-V characteristics. However, since the devices with metal overhang have relaxed electric field distribution this is likely to improve hot electron reliability.

The use of NSD diffusions in the extended drain regions gives lower series drain resistance and consequently increases the drive capability of the transistor. This is not demonstrated when the poly-gate is left floating, however, the breakdown characteristics at higher currents (FIG. 5) shown the difference in device impedance at breakdown.

The conclusive beneficial effects of "improved lightly diffused drains (ILDD) on BVdss characteristics are demonstrated within this disclosure. By devices achieving a 20 volt breakdown in a process with 180 Å oxide. Further this type of structure does not require additional process strips on the use of thick oxide to build the devices on structure.

In technologies where the required fine control of well-well and moat-to-moat dimensions cannot be maintained. The combination of NWELL and NSD diffusions could achieve the required results.

The most distinguishing feature of this process is the use of NSD diffusions in the extended drain region, offering the advantages of higher voltage capability without any sacrifice of drive capability.

The graded profile shown in FIG. 3 can also be produced by the other methods.

Figure 6:
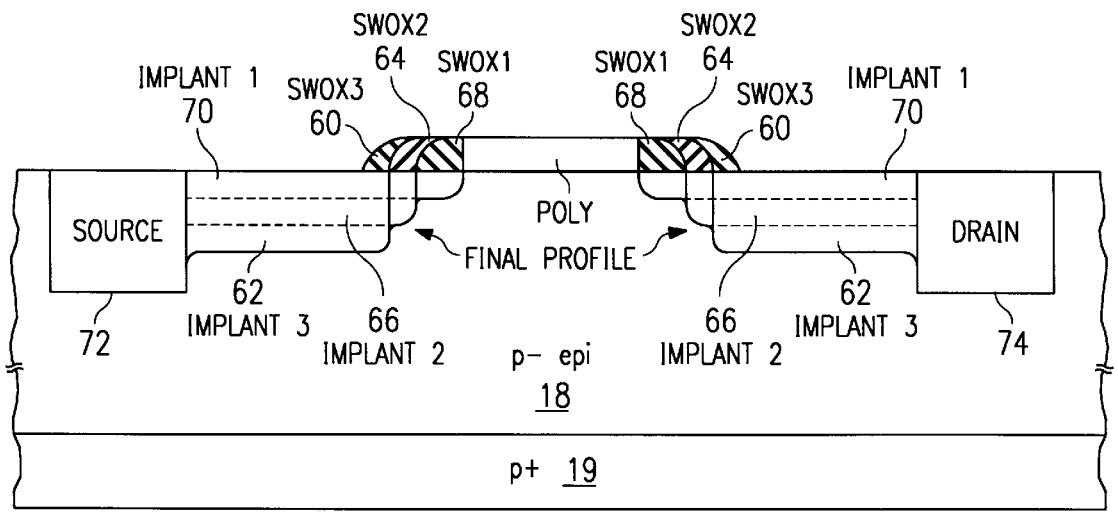
FIG. 6, is a cross-section view of a second embodiment of the present invention.

FIG. 6 shows a possible method of achieving the desired diffusion profile using successive side wall oxide deposition followed by N-implant diffusion. To produce one step in the diffusion profile will require a first side wall oxidation and one implant diffusion to produce side wall oxide 60 and implant 62. An etch step is then carried out to remove the oxide. Subsequent side wall oxidation and implant diffusions produce side wall oxide 64 and 68 and implants 66 and 70. The source 72 and drain 74 diffusions are achieved in a standard manner.

Figure 7:
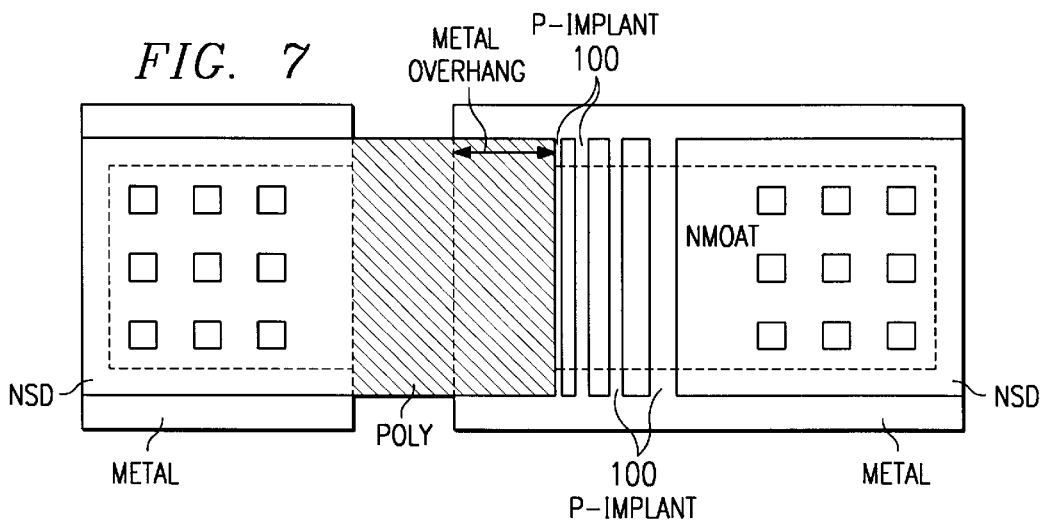
FIG. 7 and 8, are plan views of third and fourth embodiments of the present invention.

Alternatively, the desired diffusion profile can be produced by impurity compensation i.e.: counter doping. A p-type impurity is diffused through mask windows 100 as shown in FIG. 7. The width of the windows will depend n-type impurities. The net dopant will still be n-type but its volume density will decrease going from drain to gate regions giving a diffusion profile similar to that in FIG. 3. The p-type diffusion can be done either before or after the N-type diffusion.

Figure 8:
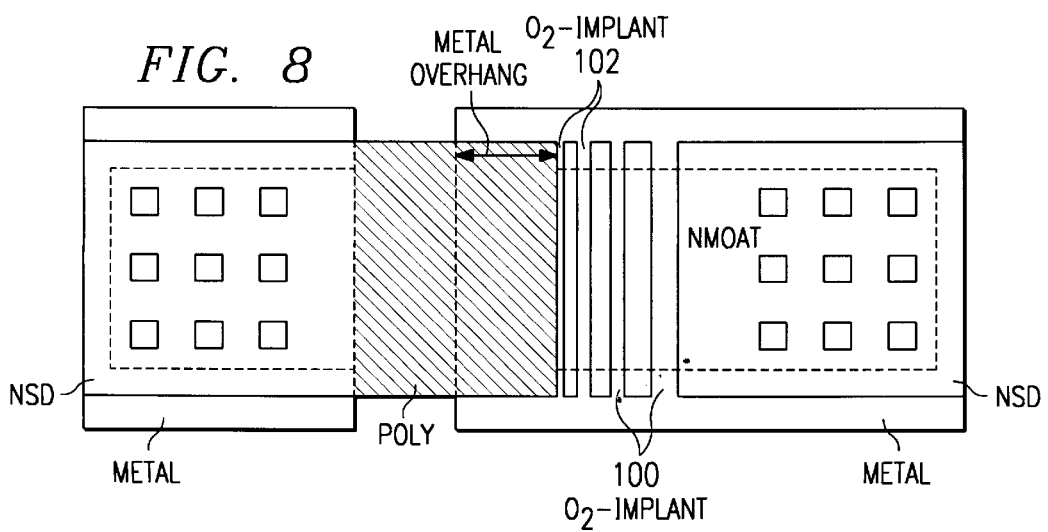

The desired diffusion profile can also be produced by using oxygen implant as diffusion barrier. By implanting oxygen through disjoint strips 102 shown in FIG. 8 followed by blanket n-type implant diffusion, doping profile as shown in FIG. 3 can be produced. Here oxygen atoms act as barriers for the n-type impurities thus decreasing the n-type dopant density in the regions where oxygen is implanted.

| Tables for FIG. 1 | |
|---|---|
| 11 | Source |
| 12 | Gate |
| 13 | Metal Overhang |
| 14 | Drain |
| 15 | NSD |
| 16 | LDD Diffusion |
| 17 | NSD |
| 18 | P-EPI |
| 19 | P + Substrate |

Table for FIG. 2

| | |
|---|---|
| 20 | Metal Overhang |
| 21 | NSD or NWELL disjoint strips |
| 22 | NSD |
| 23 | Metal |
| 24 | Poly Gate |
| 25 | N Moat |
| 26 | Metal |
| 27 | NSD |
| 28 | Bonding windows drain |
| 29 | Bonding windows source |

Table for FIG. 6

| | |
|---|---|
| 60 | Sidewall oxide |
| 62 | Implant |
| 64 | Sidewall oxide |
| 66 | Implant |
| 68 | Sidewall oxide |
| 70 | Implant |
| 72 | Source |
| 74 | Drain |
| 18 | P-EPI |
| 19 | P + Substrate |

I claim:

1. A method of forming a semiconductor device comprising the steps of:

forming a layer of a first conductivity type on a substrate;

forming source, drain and gate regions in said layer, one of said source and drain regions being formed by forming a mask over said layer having a plurality of disjoint windows of varying widths therein, said width variation being in conformance with a desired dopant profile;

diffusing a dopant through said window to form said source or drain, said diffusion forming disjoint strips of dopant in said layer which vary in accordance with said width;

heating said device to allow said dopant to diffuse into said layer to form a graded profile having a thickness which decreases towards said gate region; and forming a metal layer over said gate region.

2. The method of claim 1 wherein the step of forming said source or drain region comprises forming the region by NWELL/NSD diffusion through said mask window.

3. The method of claim 2 wherein said source and drain regions are formed in a single step.

4. The method of claim 1 wherein oxygen atoms are diffused to form said disjoint strips followed by a blanket implant diffusion to form said source or drain region.

5. The method of claim 1, wherein the step of forming the source and drain regions comprises forming the regions by an impurity compensation method.

* * * * *